(12) United States Patent
Staszewski et al.

(10) Patent No.: US 7,667,511 B2
(45) Date of Patent: Feb. 23, 2010

(54) EFFICIENT PULSE AMPLITUDE MODULATION TRANSMIT MODULATION

(75) Inventors: Robert B. Staszewski, Garland, TX (US); Dirk Leipold, Plano, TX (US); Kenneth J. Maggio, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/195,060

(22) Filed: Aug. 2, 2005

(65) Prior Publication Data
US 2005/0264333 A1 Dec. 1, 2005

Related U.S. Application Data

(63) Continuation of application No. 10/154,093, filed on May 22, 2002, now Pat. No. 6,924,681.

(60) Provisional application No. 60/293,073, filed on May 23, 2001.

(51) Int. Cl.
*H03K 3/017* (2006.01)
(52) U.S. Cl. .................. 327/172; 332/115; 332/149
(58) Field of Classification Search ......... 327/172–176, 327/34; 331/14, 17, 25; 332/115, 117, 144, 332/149
See application file for complete search history.

(56) References Cited

U.S. PATENT DOCUMENTS

| | | | | |
|---|---|---|---|---|
| 3,051,901 A | * | 8/1962 | Yacger | 375/242 |
| 4,319,359 A | * | 3/1982 | Wolf | 375/238 |
| 4,577,163 A | | 3/1986 | Culp | 331/1 A |
| 4,703,251 A | | 10/1987 | Baumgartner et al. | 324/57 K |
| 4,763,087 A | * | 8/1988 | Schrader | 333/101 |
| 4,831,280 A | | 5/1989 | Caya et al. | 307/265 |
| 5,070,254 A | | 12/1991 | Summers | 307/261 |
| 5,168,176 A | * | 12/1992 | Wanlass | 326/87 |
| 5,471,673 A | * | 11/1995 | Palmer | 455/260 |
| 5,790,612 A | * | 8/1998 | Chengson et al. | 375/373 |
| 5,903,854 A | * | 5/1999 | Abe et al. | 455/575.1 |
| 5,945,768 A | | 8/1999 | Treu, Jr. | 310/316.01 |
| 5,973,367 A | * | 10/1999 | Williams | 257/365 |
| 6,028,488 A | * | 2/2000 | Landman et al. | 331/1 A |
| 6,115,443 A | | 9/2000 | Wu et al. | 377/47 |
| 6,211,735 B1 | * | 4/2001 | Luu | 330/251 |

(Continued)

FOREIGN PATENT DOCUMENTS

JP 10-215156 11/1998

*Primary Examiner*—Lincoln Donovan
*Assistant Examiner*—Thomas J Hiltunen
(74) *Attorney, Agent, or Firm*—Wade J. Brady, III; Frederick J. Telecky, Jr.

(57) ABSTRACT

Efficient PAM transmit modulation is provided by a PAM modulator that includes an oscillator (404) that provides a clock signal, CKV, (408). The clock signal 408 and a delayed version (CKV_DLY) 420 of the clock signal are provided to a logic gate (414). The output of logic gate (414) is used as a power amplifier input signal (PA_IN) for radio frequency power amplifier (416). Depending on the relative time delay of the CKV clock signal (408) and the CKV_DLY delayed clock signal (420), the timing and duty cycle of the logic gate (414) duty cycle can be controlled. The duty cycle or pulse-width variation affects the turn-on time of the power amplifier (416); thereby establishing the RF output amplitude.

13 Claims, 5 Drawing Sheets

U.S. PATENT DOCUMENTS

| | | | |
|---|---|---|---|
| 6,294,957 B1 * | 9/2001 | Luu | 330/251 |
| 6,342,813 B1 * | 1/2002 | Imbornone et al. | 330/254 |
| 6,396,340 B1 * | 5/2002 | Schmitt et al. | 330/10 |
| 6,417,704 B1 | 7/2002 | Nakajima et al. | 327/143 |
| 6,417,730 B1 * | 7/2002 | Segallis et al. | 330/129 |
| 6,426,883 B1 * | 7/2002 | Stanley | 363/16 |
| 6,538,515 B2 | 3/2003 | Brandt | 330/185 |
| 6,631,338 B2 * | 10/2003 | To et al. | 702/107 |
| 2001/0017782 A1 * | 8/2001 | Hickman | 363/65 |

* cited by examiner

EFFICIENT PULSE AMPLITUDE MODULATION TRANSMIT MODULATION

This application is a continuation of application Ser. No. 10/154,093, filed May 22, 2002, U.S. Pat. No. 6,924,681; which claims priority under 35 USC § 119(e)(1) of provisional application No. 60/293,073, filed May 23, 2001.

TECHNICAL FIELD

This invention relates in general to the field of radio communications, and more specifically to an efficient pulse amplitude modulation (PAM) transmit modulation technique.

BACKGROUND

Referring to FIG. 1 there is shown a block diagram of a PAM modulation circuit using complex signals. The diagram mathematically highlights the steps taken in modulating the input bits ($b_K$). The incoming bit stream $b_K$ is provided to a coder, that converts the "0" and "1" digital bits into a stream of complex symbols ($a_m$). Since the coder may map multiple bits into a single data symbol, a distinction has to be made between the symbol rate and the bit rate. In communication systems such as the BLUETOOTH™ or the Global System of Mobile communications (GSM) compliant systems, there is a one-to-one correspondence between the bits and symbols: $\{0,1\} \rightarrow \{-1,1\}$. More advanced encoding schemes, such as QPSK, for example, pack two bits into a symbol.

Symbols are applied to a transmit filter, which normally produces a continuous-time signal for transmission over the continuous-time channel. The impulse response g(t) of the transmit filter is called the pulse shape and can be gaussian or raised-cosine. In modern implementations, the pulse shape is oversampled by a chip clock and represented digitally throughout the pulse filtering process, even though the filter output s(t) is usually brought back to the continuous-time domain by performing a digital-to-analog conversion (DAC) and subsequent low-pass filtering.

The digital baseband data bits $b_K$ are synchronous to the baseband clock whereas the digital filter output samples are synchronous to the chip clock. Complex signal representation requires two physical wires that carry both real-valued parts of a complex number. FIG. 2 shows another prior art block diagram that highlights another PAM transmit modulation technique using in-phase (I) and quadrature (Q) signals, that represents a natural progression towards a more physically-realizable representation as compared to FIG. 1. Finally, in FIG. 3, there is shown still another block diagram of a PAM transmit modulation circuit that uses direct digital amplitude and phase modulation. The direct phase modulation is performed by modulating the oscillator tuning input in a feed-forward manner. The direct amplitude modulation may be performed by regulating the supply voltage to a constant-envelope power amplifier.

Prior art envelope elimination and restoration PAM transmit modulation methods that adjust the supply voltage of a non-linear amplifier according to the desired amplitude, although useful, require a lot of semiconductor area to implement. This is because these circuits typically require an envelope detector, a DC-DC converter, as well as an amplitude limiter. These PAM circuits tend to suffer from impedance mismatching problems for lower amplitude output signals, and are sometimes power-inefficient from a power-added efficiency standpoint.

Still another PAM transmit modulation method used in the prior art is called Linear Amplification with Nonlinear Components (LINC). LINC techniques add two constant-envelope power amplifier (PA) outputs of properly phase-shifted signals together. LINC techniques tend to be semiconductor area intensive and power inefficient, and are thus mainly used in fixed communication equipment such as base stations, etc. A need exists in the art for a PAM transmit modulation technique that minimizes some of the problems mentioned above, so as to be useful not only in fixed communication equipment but also portable communication equipment.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
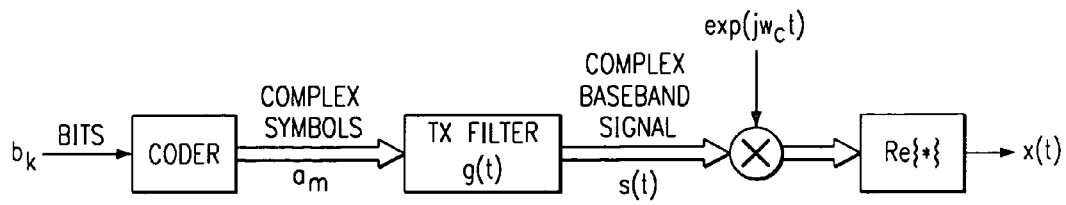
FIG. 1 shows a block diagram of a prior art PAM transmit modulator using complex signals.
Figure 2:
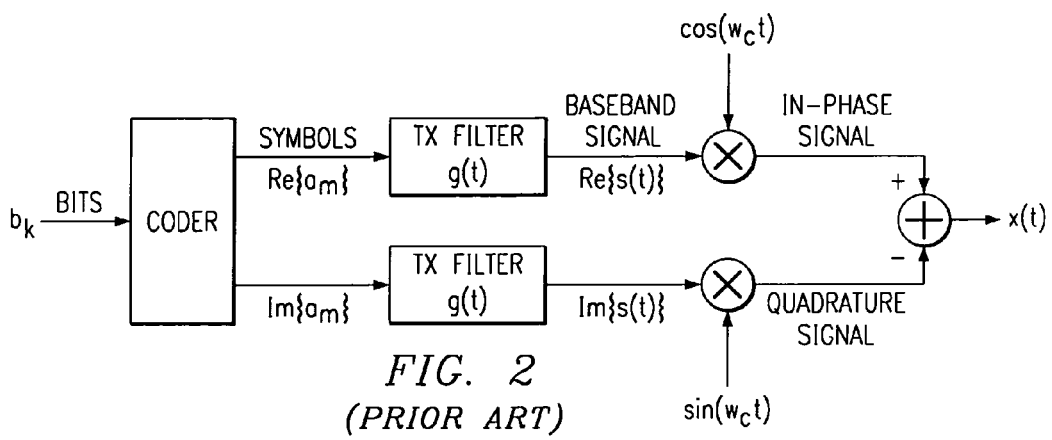
FIG. 2 shows a block diagram of a prior art PAM transmit modulator using I and Q baseband signals.
Figure 4:
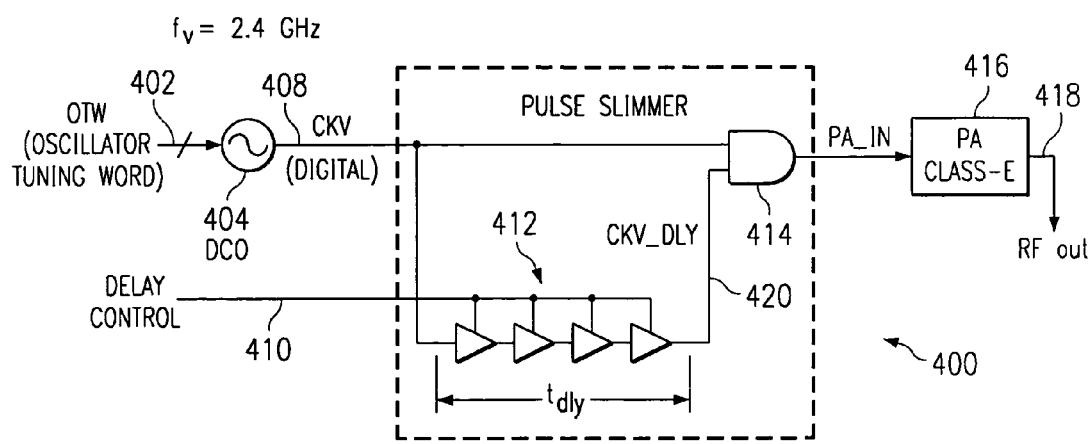
FIG. 4 shows a block diagram of a PAM modulator including power amplifier section in accordance with the invention.
Figure 3:
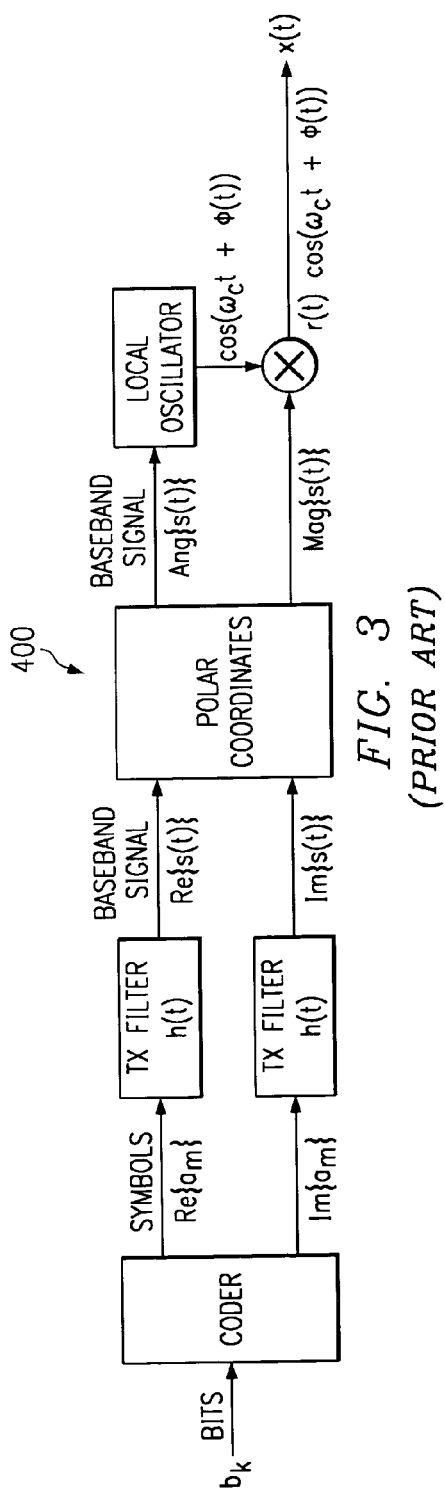
FIG. 3 shows a block diagram of a prior art PAM modulator having direct phase and amplitude modulation.
Figure 16:
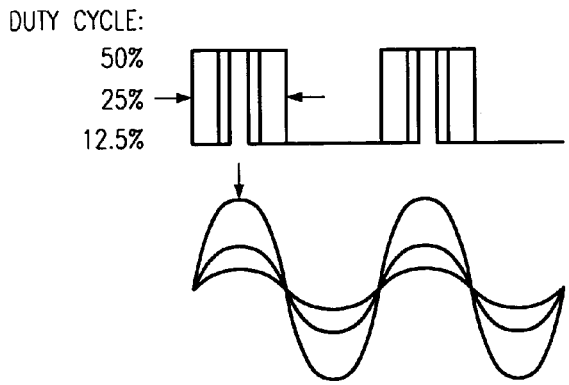
FIG. 16 illustrates how output power of power amplifier is controlled using the input signal duty cycle.

While the specification concludes with claims defining the features of the invention that are regarded as novel, it is believed that the invention will be better understood from a consideration of the following description in conjunction with the drawing figures, in which like reference numerals are carried forward. The output power of a power amplifier (PA) can be controlled by changing the duty cycle or pulse width of its RF digital input. The pulse width of the power amplifier input signal controls how long the PA is turned on during the RF cycle and, consequently, how much energy gets transferred to the load. In FIG. 16 there is shown waveforms highlighting how the PA output power is controlled using the duty cycle of the PA input signal. Referring to FIG. 4, there is shown a PAM modulator 400 using a digital pulse slimmer in accordance with the invention. The digital pulse slimming circuit is a good design for digital integration of mobile radio frequency transceivers because it does not use a RF/analog-intensive up-conversion modulator. Modulator 400 includes an input port for receiving a tuning word 402 having a bit width of $W_{DCO}$. The tuning word 402 is received by an oscillator circuit such as a Digital Controlled Oscillator (DCO) 404.

The output of DCO 404 is a single-ended digital oscillator output clock signal (CKV) 408. The CKV clock signal 408 is provided to a logic "AND" gate 414 at one input, while a delayed version of the CKV signal (CKV_DLY) 420 is provided to the other input of AND gate 414. Although shown as a single AND logic gate 414, the logic circuit receiving both the clock 408 and delayed clock 420 signals can be designed using any number of different circuits known to those skilled in the art.

The delay to the CKV signal is provided by delay circuit 412, which preferably comprises two or more inverters, coupled in series. The delay circuit 412 can also be constructed using buffers or other circuits well known in the art. In which case, the delay can be controlled using a current-starving mechanism or variable capacitive load. In the preferred embodiment, the delay is controlled through a variable power supply voltage. The delay circuit 412 can also be formed as a delay circuit having a plurality of taps. The delay provided by the delay circuit 412 is controlled by a "delay control signal" 410 which in this embodiment is an analog supply voltage. Coarse delay control can be performed by adding and/or subtracting dynamically the number of inverters or buffers in the delay path. "Finer" delay control can be performed by selecting the taps of a conventional delay line (not shown). An alternative method to increase the effective delay resolution would require changing the number of inverters at a rate much higher than the symbol rate of the modulator. The time-averaged delay value of the number of inverters could therefore be controlled with a fractional resolution. A conventional ΣΔ (sigma-delta) digital dithering stream would be a good choice to use given the noise shaping properties.

The AND logic gate 414 output (PA_IN) is connected to a class-E power amplifier 416 which provides the RF output signal 418. Depending on the relative time delay of the two paths, the timing and duty cycle of the AND logic gate output can be controlled. The duty cycle or pulse-width variation directly affects the turn-on time of the PA digital switch, thus establishing the RF output amplitude. The amplitude-versus-pulse width relationship is quite linear, except for the very narrow input pulse that might not have enough energy to reliably turn on the switch. This non-linear region of operation can descriptively be called a "dead zone" (a reference to a commonly used term in conventional phase detectors). The dead zone can be entirely avoided at a system level by choosing modulation techniques that guarantee a certain minimum level of the signal envelope. For example, GFSK and GMSK are constant-envelope modulation schemes. Offset-8PSK is a modulation technique used in the GSM-EDGE communication standard that purposefully rotates the I-Q constellation with every symbol so as to avoid the origin. These methods have been employed for a long time to improve efficiency of power amplifiers and to facilitate the use of a saturation mode of operation.

Figure 6:
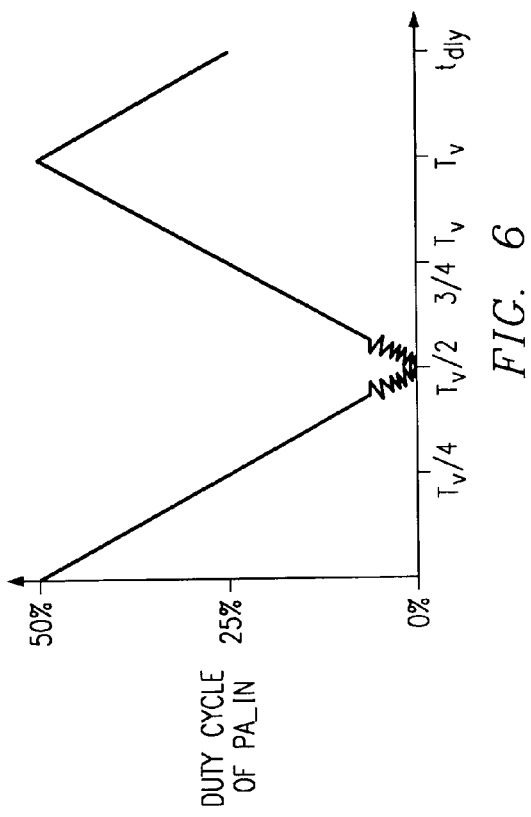
FIG. 6 is a chart highlighting the duty cycle of the input signal to the power amplifier (PA_IN) versus time delay.
Figure 5:
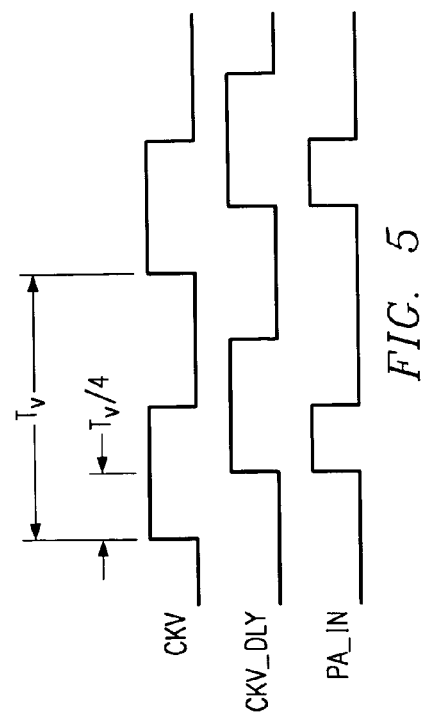
FIG. 5 shows a timing diagram of some of the signals shown in FIG. 4.
Figure 7:
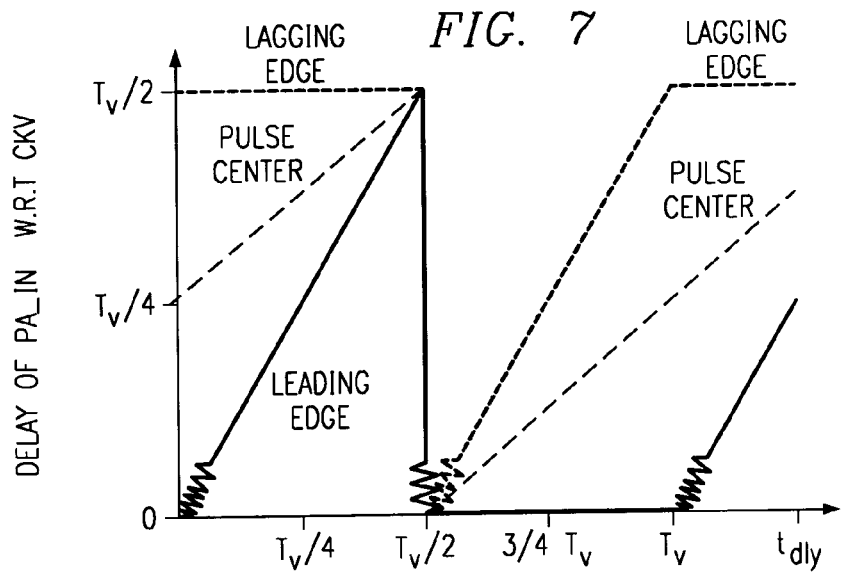
FIG. 7 is a chart highlighting the delay of the PA_IN signal with regard to the CKV signal versus time delay.

FIG. 5 highlights the timing of the CKV, CKV_DLY and PA_IN signals for an example where $t_{dly}=T_V/4$. FIG. 6 highlights the duty cycle of PA_IN versus different $t_{dly}$. The timing diagram shown in FIG. 7 shows two regions of operation with different behavior of leading and lagging output edges with respect to the $t_{dly}$ delay of the delay path. In the first region, the leading edge of the output traverses but the lagging edge does not. A reversed operation takes place in the second region (dotted line). Since the pulse duration is determined by where its center lies, neither of the two provide orthogonality of the phase modulation in the oscillator and the amplitude modulation in the oscillator pulse slimmer circuit. Consequently, the phase adjustment is necessary with the amplitude change. This is not a difficult task since the phase control is in the digital domain through manipulation of the oscillator tuning word (OTW).

Figure 11:
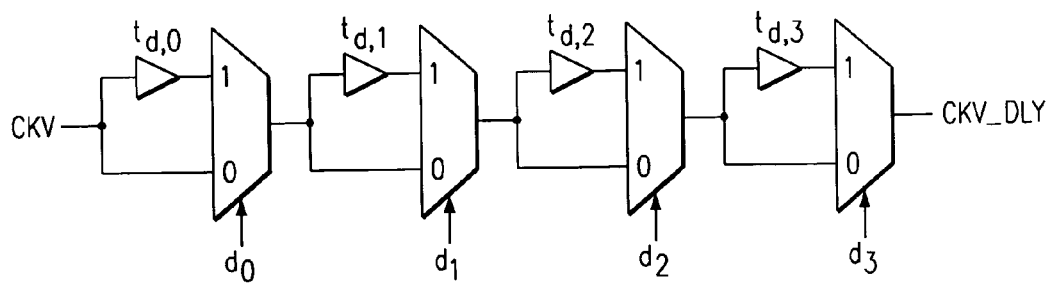
FIG. 11 shows an alternate discrete delay control circuit in accordance with the invention.

In FIG. 11, there is shown a delay path example of four buffer delay stages that can be used as an alternate delay control circuit for the circuit in FIG. 4. The buffer delay can be the same in each stage, although it is not required. In this particular case, it would result in a total of five possible delay values, from zero to four. A better solution depending on the particular design requirements could use a binary-weighted arrangement of the buffer delays. In this case, it would result in a total of 16 possible delay values, from 0 to 15, not including the fixed multiplier delays. The "effective" delay can be expressed by the following equation:

$$t_{dly} = \sum_{j=0}^{N-1} d_j * t_{d,0} * 2^j = t_{d,0} * \sum_{j=0}^{N-1} d_j * 2^j$$

where, N (=4 in this example) is the number of binary-weighted stages, $d_j$ is the $J_{th}$ control word bit and $t_{d,0}$ is the basic element delay of weight $2^0$. Each next stage contains twice the amount of the delay, which can be conveniently realized as doubling the number of inverters or buffers.

Figure 12:
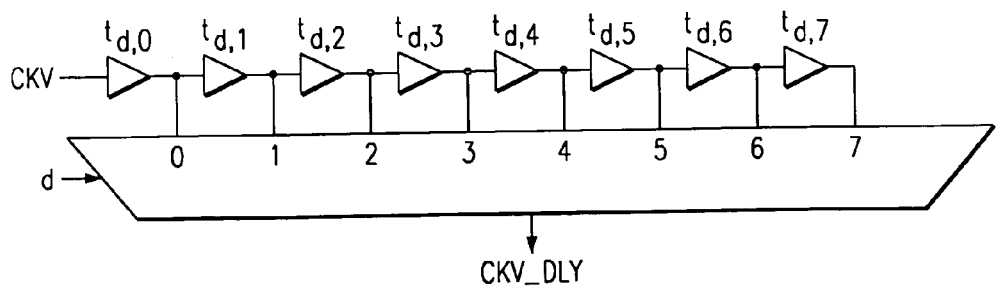
FIG. 12 shows another alternate discrete delay control circuit in accordance with the invention.

The delay control word must be synchronized to the CKV clock signal in order to avoid changing it while the signal is still propagating. The delay buffer cycle or pulse-width variation directly affects the turn-on time of the PA digital switch, thus establishing the RF output amplitude. The delay buffer arrangement of FIG. 11 is preferred over a transversal delay line configuration in which a large multiplexer selects various taps of a delay line comprised of a string of inverters or buffers as shown in FIG. 12. This is mainly due to the difficulties of building a fast large multiplexer with equalized delays for the various inputs.

Figure 13:
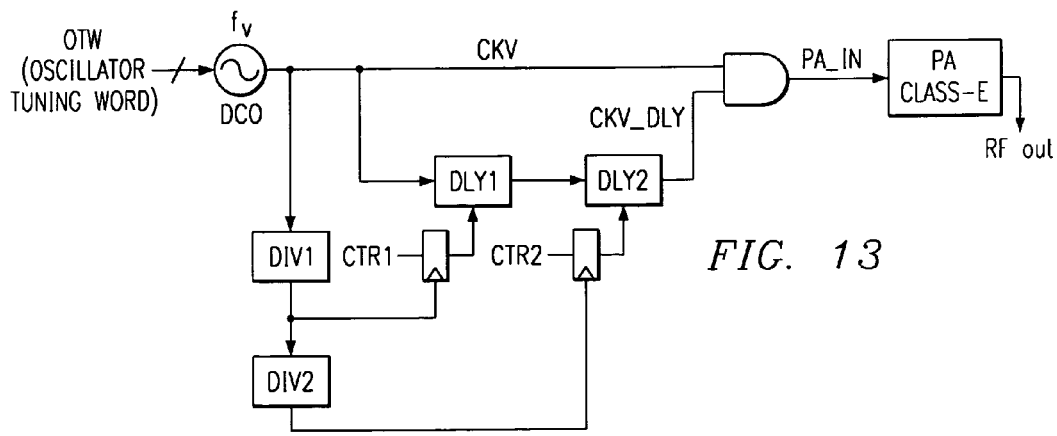
FIG. 13 shows a discrete delay of the PWM with additional high-speed dithering in accordance with another embodiment of the invention.

An alternative method to increase the effective delay resolution below that of a single inverter/buffer would be to change dynamically the number of inverters at a rate much higher than the symbol rate. The time averaged delay value of the number of inverters could thus be controlled with a fractional resolution for a fractional frequency division ratio. Here again, a ΣΔ digital dithering system is a good choice due to its noise shaping properties. It should be noted that a binary-weighted delay control would not work very well with the high-speed dithering. However, the delay path could be cascaded into a lower-rate binary-weighted structure and a higher-rate unit-weighted structure that would be subject to the dithering. Such an implementation is shown in FIG. 13 with high-speed delay dithering DLY1 and low-speed delay selection DLY2. DIV1 and DIV2 are CKV clock edge dividers and can be implemented as power-of-2 numbers.

Figure 9:
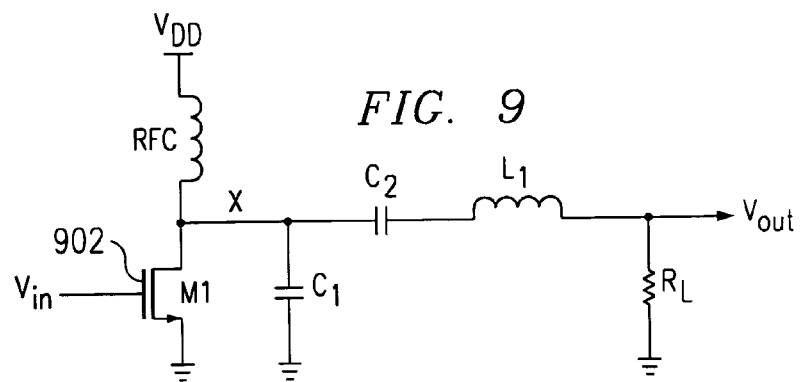
FIG. 9 shows a near Class-E power amplifier in accordance with the invention.

A Class-E or near Class-E power amplifier 416 is used in the preferred embodiment given that it is ideally suited for deep-submicron CMOS designs. The end stage transistor in a Class-E power amplifier operates as a switch, unlike in class A, B, and C power amplifier stages where the power amplifier's transistor acts as a current source and must have it's drain-to-source voltage ($V_{DS}$) precisely controlled. Another advantage of using a Class-E power amplifier is since it uses a transistor switch 902 as shown in FIG. 9, the switch works best with digital waveforms, preferably having sharp rise and fall times. This is where the deep-submicron CMOS strengths lie; since the DCO 404 output is already in a digital format, the duty cycle of the input waveform can conveniently control the output amplitude and power. A Class-E stage is also preferred over a Class-F amplifier, since a Class-F amplifier has a filtering network that requires an additional LC tank circuit, which requires more semiconductor area to implement than a Class-E amplifier. Finally, using a Class-E amplifier as shown in FIG. 9 provides for high power efficiency typically in the 80-90% efficiency range.

Figure 10:
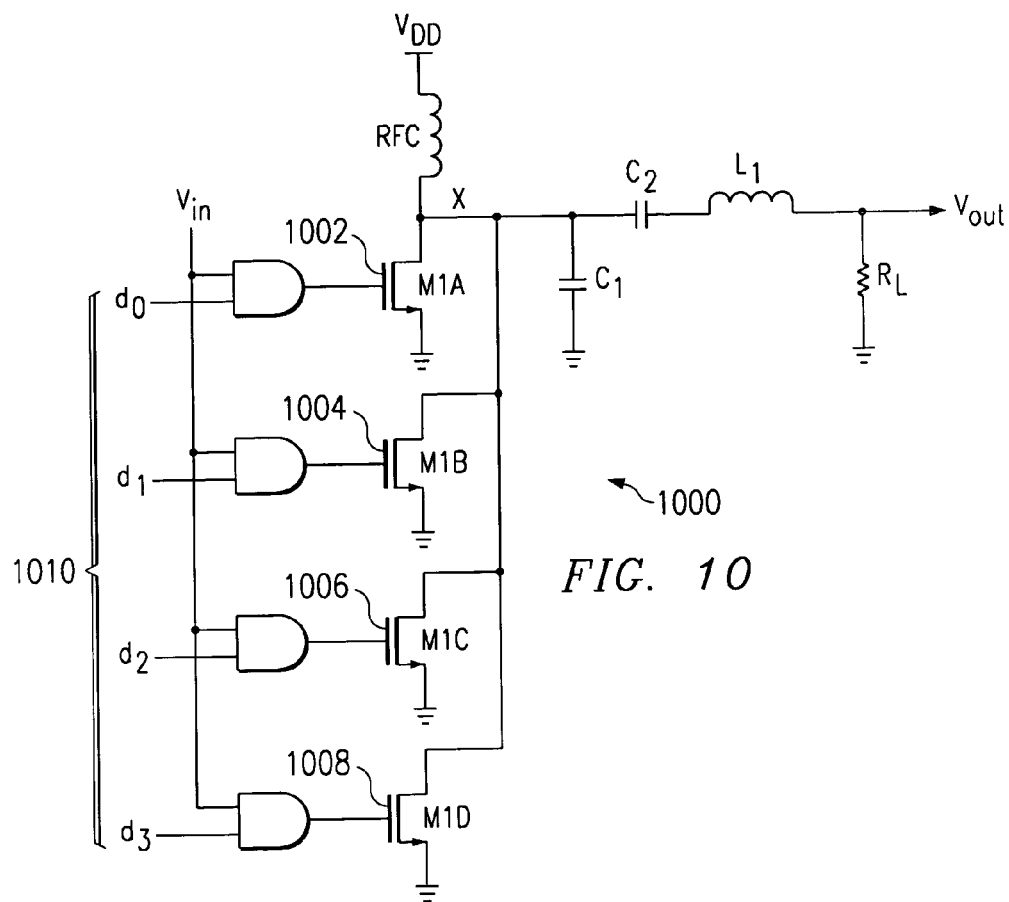
FIG. 10 shows a near Class-E power amplifier having multiple switches in order to accomplish coarse digital amplitude modulation in accordance with the invention.

In FIG. 10 there is shown another amplifier 1000 that can be used in the PAM modulator circuit 400 in block 416. Amplifier 1000 includes a plurality of parallel switchable transistor switches 1002-1008 that are used to provide coarse digital amplitude modulation. The plurality of transistor switches 1002-1008 are digitally controlled using appropriate digital logic and a digital control signal 1010 that is unit-weighted or binary-weighted. Amplifier 1000 includes matching network C1, C2 and L1 coupled to the plurality of transistor switches 1002-1008.

As the timing diagrams of FIGS. 5-7 show, it is advantageous to operate the modulator circuit of FIG. 4 in the region where the PA input pulse arrival time is not dependent on the delay ($t_{dly}$) of the delay path. The timing diagrams of FIGS. 6 and 7 show two regions of operation with different behavior of leading and lagging output edges with respect to the $t_{dly}$ delay of the delay path. In the first region, the leading edge of the output traverses, but the lagging edge does not. A reverse operation takes place in the second region (dotted line). Since the pulse position is determined of where the center lies, neither of the two provides orthogonality of the phase modulation in the oscillator and the amplitude modulation in the oscillator pulse slimmer circuit.

In order to save power and reduce jitter due to the long chain of buffers or inverters in the delay circuit 412, it might be beneficial to use the "inverted CKV_DLY signal provided as the output of the delay circuit 412. This can be accomplished through either feeding the delay path from the inverted CKV clock output, or inverting the CKV_DLY signal itself. It is important to note that the maximum required amount of delay is never greater than half of the CKV clock cycle since the negated CKV (of the opposite phase) can always be used.

The dynamic amplitude modulation method can be used in its simplest form to statically regulate the output power of the Class-B power amplifier. It is done in a very efficient manner by injecting enough energy into the PA with every oscillator cycle to achieve the desired output amplitude or power. This is the main application of the pulse-width modulation for use in some transmitter applications (e.g., BLUETOOTH transmitters, etc.) which do not require dynamic amplitude modulation. However, the idea of dynamic amplitude control can be useful for other applications which may require it, such as IEEE 802.11b and EDGE standard compliant devices.

Figure 14:
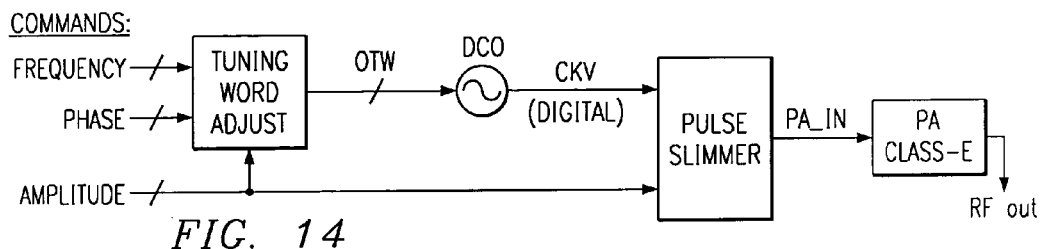
FIG. 14 shows a block diagram of a PAM modulator providing PAM modulation through tuning word adjustment.
Figure 15:
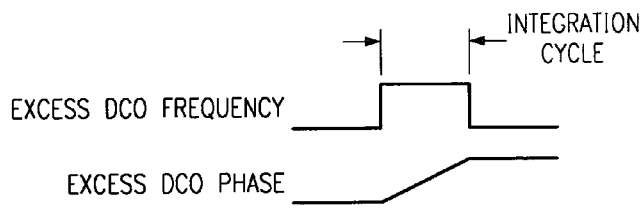
FIG. 15 shows a timing diagram highlighting excess DCO frequency and phase for the modulator of FIG. 14.

A block of a PAM modulation (using polar coordinate representation) using a tuning word adjustment in accordance with another embodiment of the invention is shown in FIG. 14. Since phase is integral of frequency:

$$\theta(t) = 2\pi \int_{-\infty}^{t} f(t)dt$$

the DCO phase modulation is accomplished through a timed frequency adjustment. In a discrete-time system, the frequency control is performed only at update intervals, usually determined by the frequency reference clock edges of period $T_R$. The above equation is re-written for the discrete-time operation as follows:

$$\theta(k) = 2\pi \sum_{-\infty}^{k} f(k) T_R$$

where "k" is a time index. To simplify the analysis, the two previous equations can be interpreted as pertaining to the excess phase and amplitude quantities, as shown as an example in FIG. 15.

The magnitude command in FIG. 14 modulates the PA output amplitude using one of the previously discussed methods. However, as shown in FIGS. 4 and 7, the side effect of the pulse slimming method is that the pulse center travels with the edge delay. Fortunately, this pulse center location is easy to predict, especially in the fully digital control environment. The proposed correction of the pulse center dislocation is to change the DCO frequency for a single clock cycle such that the resulting phase is equivalent or closely matched to the predicted pulse center shift.

Figure 8:
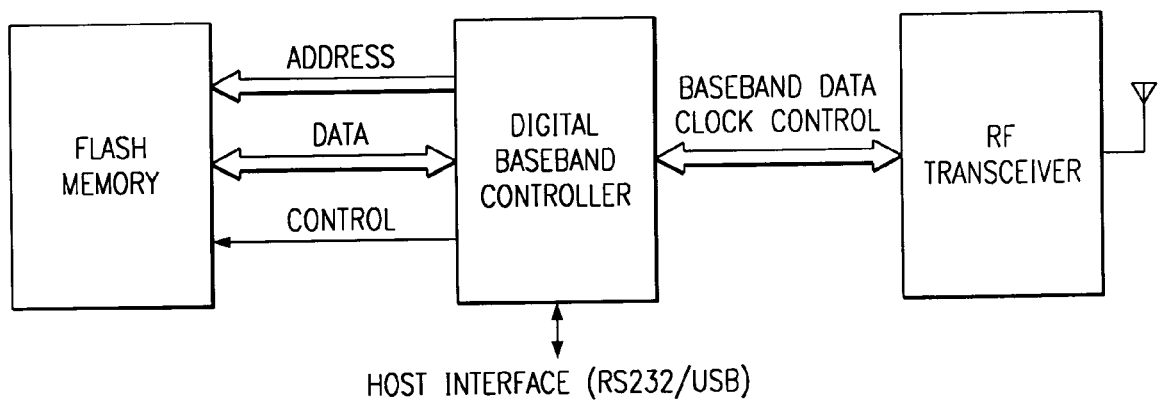
FIG. 8 shows a block diagram of a transceiver that implements the present invention.

In FIG. 8 there is shown a simplified block diagram of a communication transceiver that can take advantage of the PAM transmit modulator shown in FIG. 4. Compared to conventional I-Q based transmit modulation schemes, the present invention requires no I-Q modulator nor does it need to perform digital-to-amplitude conversion of I-Q baseband signals as required in I-Q based transmit modulation schemes. Given the highly digital implementation of the present invention, it is very suitable for deep sub-micron CMOS process implementation. The transmit modulation technique disclosed is very power efficient through the utilization of a highly-nonlinear class-E power amplifier with regulated input duty cycle using digital pulse slimming. Also, the present invention does not require an I-Q modulator, nor digital-to-amplitude conversion of I-Q baseband signals.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

The invention claimed is:

1. A pulse amplitude modulator, comprising:
   a power amplifier having an input port for receiving an oscillator clock signal and a plurality of digitally controlled parallel connected transistors that provide for amplitude modulation, wherein the plurality of digitally controlled parallel connected transistors comprises a first transistor coupled in parallel with a second transistor;
   a matching network, the matching network coupled to said digitally controlled parallel connected transistors;
   a digitally controlled oscillator (DCO) having an input;
   a tuning word adjustment circuit coupled to the input, the tuning word adjustment circuit being responsive to an amplitude control signal; and wherein said DCO is operable to provide the oscillator clock signal; and a means for amplitude control of an output of the DCO in response to the amplitude control signal.

2. A pulse amplitude modulator as defined in claim 1, further comprising AND gates.

3. A pulse amplitude modulator as defined in claim 1, wherein the amplitude modulation is responsive to a selected number of said active parallel connected transistors.

4. A pulse modulator as defined in claim 1, further comprising means for controlling the number of said parallel connected transistors that are active in accordance with the digital control signal.

5. The pulse amplitude modulator as defined in claim 1, wherein the amplifier further comprises AND functionality.

6. The pulse amplitude modulator of claim 1, wherein an output amplitude of the power amplifier is generated via AND functionality.

7. A pulse amplitude modulator, comprising:
    a power amplifier having an input port for receiving an input signal and a plurality of digitally controlled parallel connected transistors that provide for amplitude modulation, wherein the plurality of digitally controlled parallel connected transistors comprises a first transistor coupled in parallel with a second transistor;
    a matching network, the matching network coupled to said digitally controlled parallel connected transistors;
    a digitally controlled oscillator (DCO) having a second input; and
    a tuning word adjustment circuit coupled to the second input, the tuning word adjustment circuit being responsive to an amplitude control signal; and wherein said DCO is operable to provide the input signal for the power amplifier.

8. The pulse amplitude modulator as defined in claim 7, wherein the amplifier further comprises AND functionality.

9. The pulse amplitude modulator as defined in claim 7, wherein the digitally controlled parallel connected transistors provide for amplitude modulation of the input signal.

10. A transmitter circuit, comprising:
    a pulse amplitude modulator (PAM) including:
        a digitally controlled oscillator (DCO) having an input and further comprising a tuning word adjustment circuit coupled to the input of the DCO, the tuning word adjustment circuit being responsive to an amplitude control signal, the DCO providing a clock signal; and
        a digitally controlled power amplifier receiving and responsive to the DCO clock signal and the amplitude control signal.

11. A transmitter circuit as defined in claim 10, wherein the tuning word adjustment circuit changes the DCO frequency for a single clock cycle, whereby the amplitude control signal and a phase control signal input to the tuning word adjustment circuit are orthogonal.

12. A transmitter circuit as defined in claim 10, wherein the amplitude control signal performs amplitude modulation.

13. The transmitter circuit as defined in claim 10, wherein the amplitude control signal is generated via AND functionality.

* * * * *

UNITED STATES PATENT AND TRADEMARK OFFICE
CERTIFICATE OF CORRECTION

PATENT NO.        : 7,667,511 B2                                    Page 1 of 1
APPLICATION NO. : 11/195060
DATED             : February 23, 2010
INVENTOR(S)       : Staszewski et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 41 days.

Signed and Sealed this

Twenty-eighth Day of December, 2010

David J. Kappos
*Director of the United States Patent and Trademark Office*